United States Patent
Hara et al.

(10) Patent No.: US 8,441,291 B2
(45) Date of Patent: May 14, 2013

(54) PLL USING INTERPOLATIVE DIVIDER AS DIGITALLY CONTROLLED OSCILLATOR

(75) Inventors: Susumu Hara, Austin, TX (US); Adam B. Eldredge, Austin, TX (US); Zhuo Fu, Taipei (TW); James E. Wilson, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 13/243,149

(22) Filed: Sep. 23, 2011

(65) Prior Publication Data

US 2013/0076415 A1 Mar. 28, 2013

(51) Int. Cl.
*H03L 7/06* (2006.01)
(52) U.S. Cl.
USPC .......................................... 327/156; 327/147
(58) Field of Classification Search .................. 327/156, 327/147
See application file for complete search history.

(56) References Cited

U.S. PATENT DOCUMENTS

| 7,417,510 | B2 | 8/2008 | Huang |
| 7,436,227 | B2 | 10/2008 | Thomsen et al. |
| 8,248,175 | B2 * | 8/2012 | Hara ............................ 331/179 |
| 8,310,886 | B2 * | 11/2012 | Rhee et al. ..................... 365/194 |
| 8,315,575 | B2 * | 11/2012 | Puma et al. ..................... 455/76 |
| 8,321,169 | B2 * | 11/2012 | Brooks et al. .................. 702/99 |
| 2012/0038400 | A1 * | 2/2012 | Talaga, Jr. ..................... 327/156 |

* cited by examiner

*Primary Examiner* — Adam Houston
(74) *Attorney, Agent, or Firm* — Abel Law Group, LLP

(57) ABSTRACT

One or more PLLs are formed on an integrated circuit. Each PLL includes an interpolative divider configured as a digitally controlled oscillator, which receives a reference clock signal and supplies an output signal divided according to a divide ratio. A feedback divider is coupled to the output signal of the interpolative divider and supplies a divided output signal as a feedback signal. A phase detector receives the feedback signal and a clock signal to which the PLL locks. The phase detector supplies a phase error corresponding to a difference between the clock signal and the feedback signal and the divide ratio is adjusted according to the phase error.

19 Claims, 3 Drawing Sheets

PLL USING INTERPOLATIVE DIVIDER AS DIGITALLY CONTROLLED OSCILLATOR

BACKGROUND

1. Field of the Invention

This invention relates to generation of clock signals and more particularly to generating clock signals using phase-locked loops with interpolative dividers.

2. Description of the Related Art

High speed, high port density networking applications require multiple jitter attenuating phase-locked loops (PLLs). Markets for such devices include the 10 Gigabit, 40 Gigabit, and 100 Gigabit telecom/datacom infrastructure. However, putting multiple PLLs on a single integrated circuit can result in a large silicon area being utilized, particularly if the PLLs utilize LC voltage controlled oscillators. In addition, LC oscillators with close frequencies can have cross talk problems.

SUMMARY

Accordingly, at least some of the shortcomings of LC oscillator based PLLs are addressed in one or more embodiments described herein.

One embodiment includes an interpolative divider configured to receive a first input signal and supply an output signal divided according to a divide ratio. A phase detector is coupled to a feedback signal that corresponds to the output signal of the interpolative divider and the phase detector is coupled to a second input signal. The phase detector supplies a phase error corresponding to a difference between the second input signal and the feedback signal. A loop filter receives the phase error and supplies a filtered phase error for use in generation of the divide ratio.

In another embodiment a PLL is provided that includes a phase detector coupled to a feedback signal and to an input signal, the phase detector configured to supply a phase detector output signal corresponding to a difference between the input signal and the feedback signal. A loop filter is coupled to receive the phase detector output signal and to provide a loop filter output signal. A digitally controlled interpolative divider is coupled to the loop filter output signal and to a reference clock signal and responsive to a divide ratio signal to supply a divided reference clock signal as an interpolative divider output signal, the divide ratio signal being determined using the loop filter output signal. A feedback divider is coupled to divide the interpolative divider output signal and supply the feedback signal.

In another embodiment a method is provided that includes receiving a reference clock signal at an interpolative divider, generating an interpolative divider output signal in the interpolative divider that is a divided reference clock signal determined according to a divide ratio supplied to the interpolative divider. The method further includes determining a phase difference between a feedback signal from the interpolative divider and an input clock signal and using the phase difference to adjust the divide ratio used by the interpolative divider.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
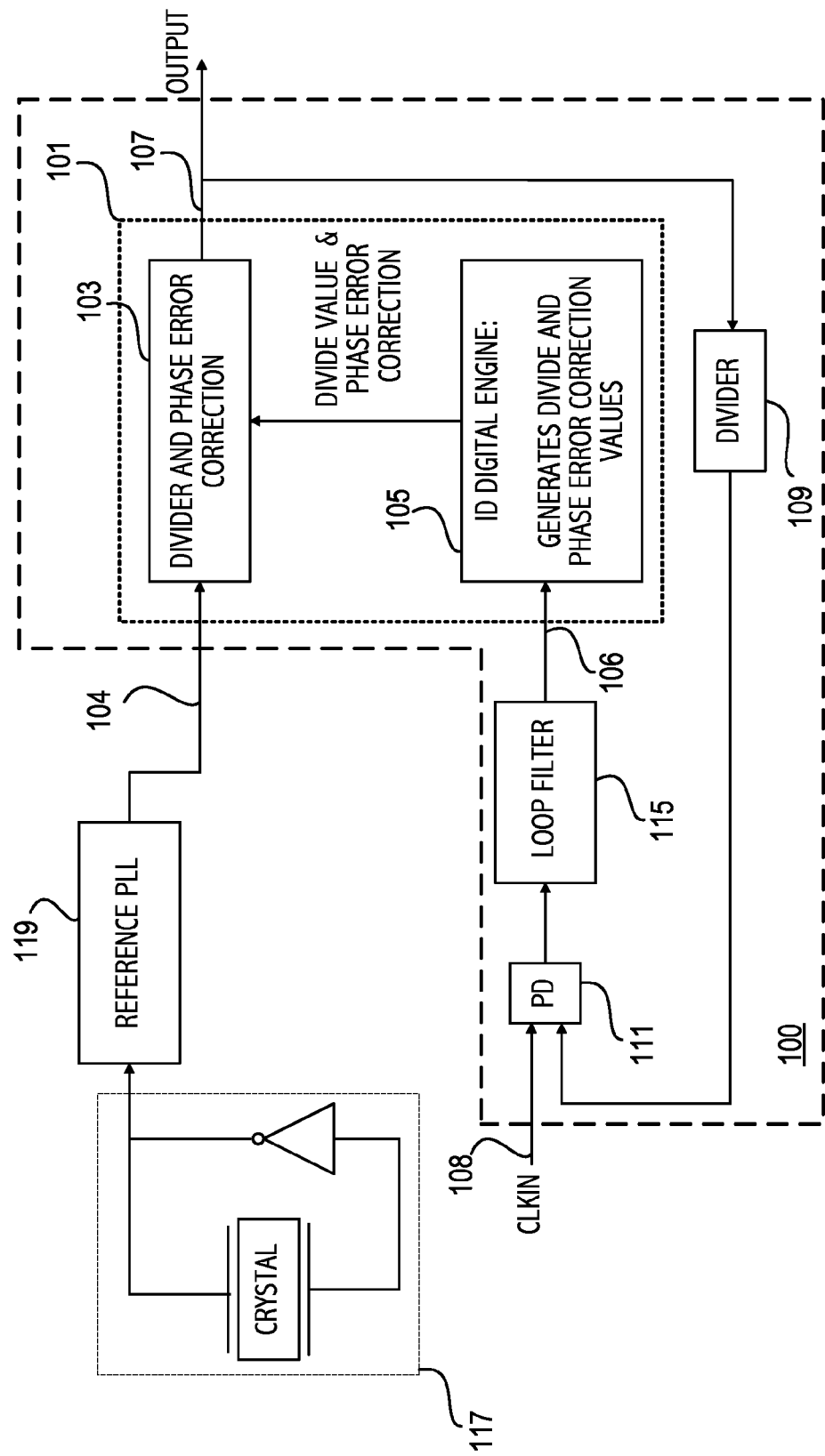
FIG. 1 illustrates a PLL including an interpolative divider.

FIG. 1 illustrates an embodiment in which PLL 100 incorporates an interpolative divider 101 as a digitally controlled oscillator (DCO). The interpolative divider 101 includes a divider and phase interpolator 103 and a control block 105, which are explained in more detail herein. The interpolative divider 101 divides an input signal 104 according to a divide ratio 106 and supplies an output signal 107. The output 107 of the interpolative divider is supplied to a feedback divider 109 of the PLL 100. The feedback divider supplies phase detector 111. Note that the feedback divider, while shown in FIG. 1, may be omitted in other embodiments, in which case the output of the interpolative divider is coupled directly to the phase detector. The phase detector also receives as an input signal CLKIN to which the PLL is designed to lock. The phase detector supplies a phase error signal reflecting the difference between the CLKIN signal and the feedback signal to loop filter 115, which in an embodiment is an all digital loop filter. The loop filter 115 is typically configured as a low pass filter. The filtered phase error signal is used to generate a divide ratio that is utilized by the interpolative divider control block 105.

The interpolative divider receives input signal 104 from a reference phase-locked loop 117. The reference PLL 117 may receive its input signal from a crystal oscillator 119. In other embodiments the reference PLL may instead be a MEMS oscillator or other frequency source.

Figure 2:
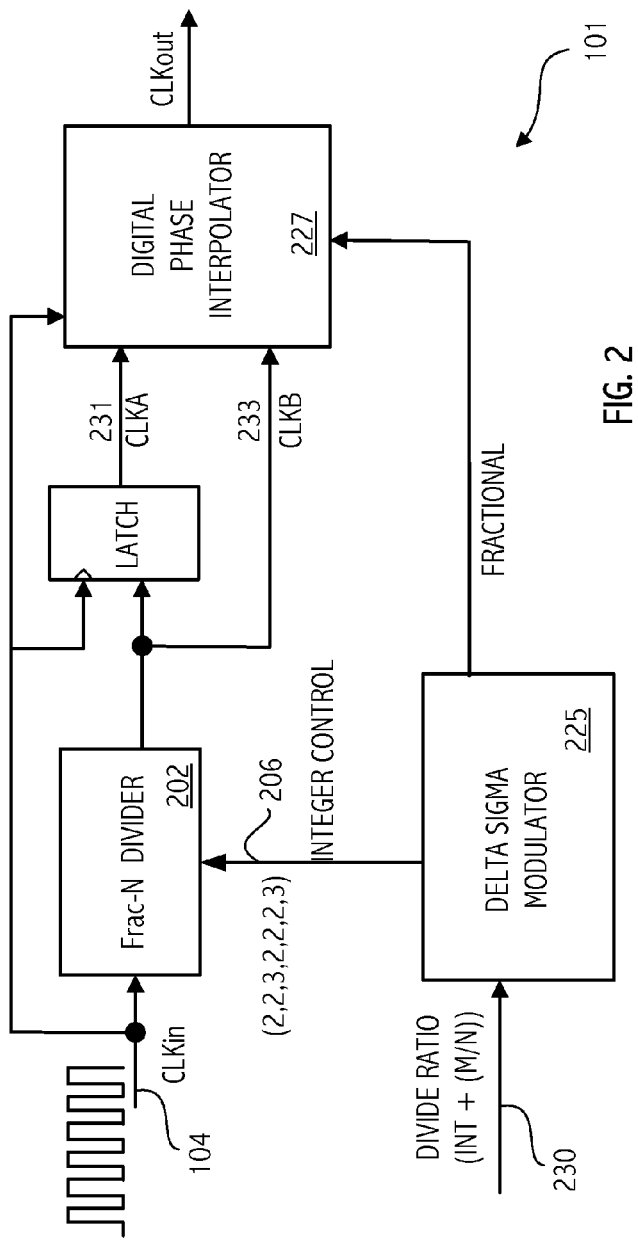
FIG. 2 illustrates additional details of an exemplary interpolative divider.

Referring to FIG. 2, an exemplary interpolative divider that may be used for interpolative divider 101 is illustrated. The divider includes a fractional-N divider 202 providing multi-modulus dividing capability, which receives the input clock 104. In an embodiment a first order delta sigma modulator 225 receives the divide ratio that includes an integer portion (INT) and a fractional portion (M/N) where M and N are integers and M<N. Note that the divide ratio may be received with the integer portion incorporated into the fraction, i.e., M>N.

Figure 3:
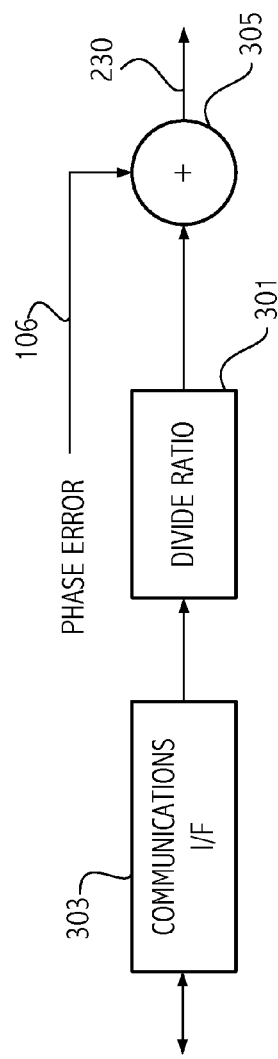
FIG. 3 illustrates an embodiment for adjusting the divide ratio according to the phase error.

Referring to FIG. 3, an initial divide ratio may be stored by a volatile (or non-volatile) memory 301 and is adjusted by the phase error supplied on node 106 (see FIG. 1). In some embodiments, a communications interface 303 on the integrated circuit may provide an initial divide ratio to a programmable register 301. The divide ratio may be selected according to, e.g., the desired output frequency of PLL 100, the frequency of input clock signal 104, and the frequency of the CLKIN signal 108. That initial divide ratio is supplied to a summing circuit 305, which adjusts (increases or decreases) the divide ratio 230 supplied to the interpolative divider to reflect the phase error signal supplied through loop filter 115.

Referring back to FIG. 2, the fractional-N divider 202 receives divide control signal 206, which is a stream of integer divide values to approximate the actual divide ratio. For example, as shown in FIG. 2, for a divide by 2⅓, the divider 202 receives a sequence such as (2, 2, 3, 2, 2, 3). The digital quantization error, corresponding to the fractional portion of the divide signal generated by the delta sigma modulator 225, is supplied to the digitally controlled phase interpolator 227. That is, the delta sigma modulator generates a term that includes an integer portion and a fractional portion. The fractional portion is used for phase interpolation and the integer portion is supplied to divider 202. The jitter introduced by the fractional-N divider 202 is canceled by interpolation, e.g., between CLKA 231 and CLKB 233 in phase interpolator 227 based on the digital quantization error supplied by the delta sigma modulator 225. Thus, the divider 202 divides down the input clock signal 103 according to the control information provided by the delta sigma modulator 225. The phase interpolator 227 cancels the quantization errors in the output of the fractional-N divider 202. Additional information on clock synthesis using phase interpolation can be found in U.S. Pat. No. 7,417,510, filed Oct. 17, 2006, naming Yunteng Huang as an inventor, and entitled "Direct Digital Interpretive Synthesis," which application is incorporated by reference herein.

Figure 4:
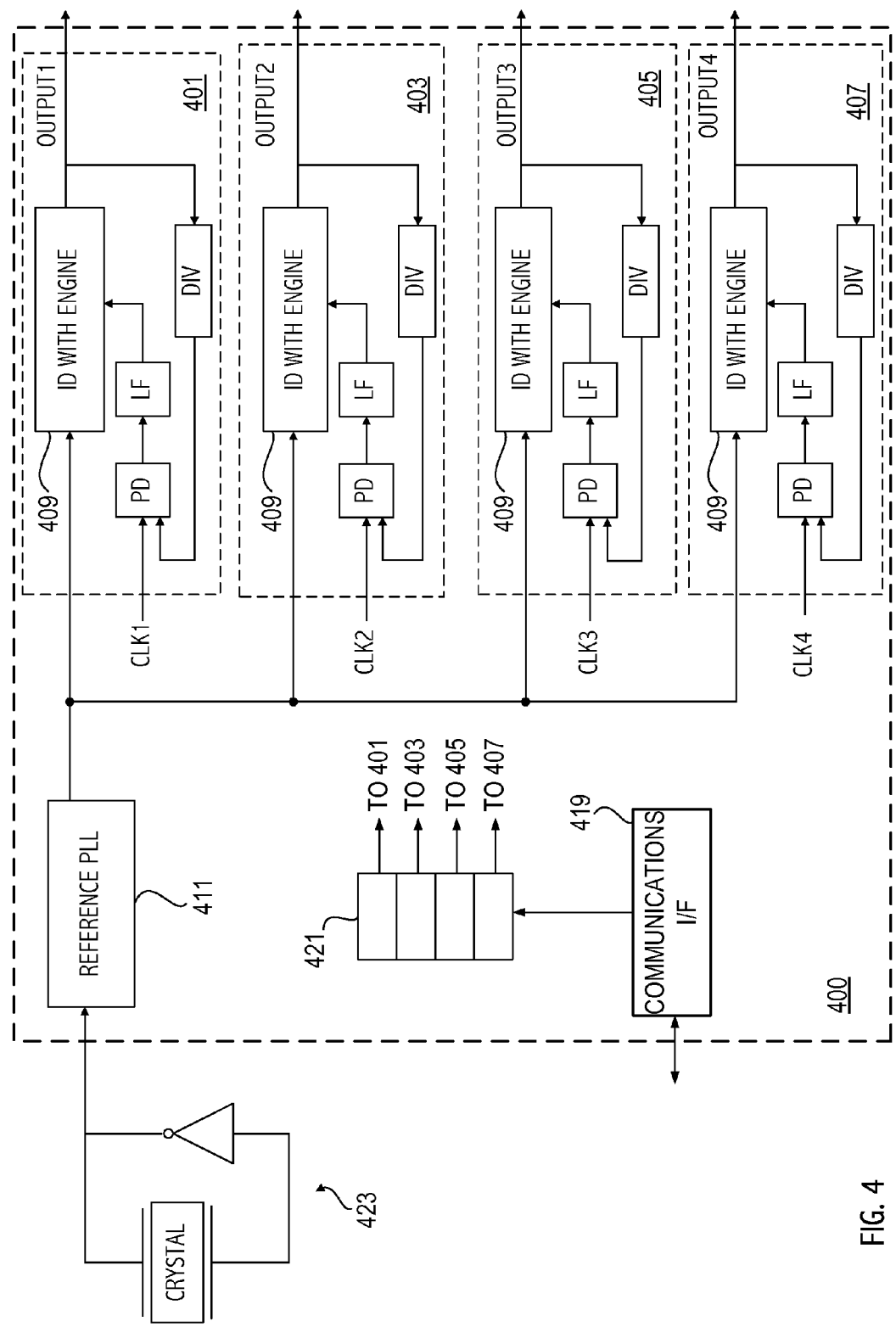
FIG. 4 illustrates a multi-channel PLL according to an embodiment.

The PLL shown in FIG. 1 allows a cost effective implementation of a multi-channel PLL such as the exemplary embodiment illustrated in FIG. 4. Referring to FIG. 4, an exemplary embodiment includes a plurality of PLLs 401, 403, 405, and 407 formed with interpolative dividers 409 on an integrated circuit 400. Instead of having multiple VCOs, the embodiment of FIG. 4 allows using a single (and simple) reference PLL 411 and the multiple digital PLLs with Interpolative Dividers. Each of the PLLs 401, 403, 405, and 407 can receive their own clock signal (CLK1, CLK2, CLK3, and CLK4) to which the respective PLLs lock. At the same time, the reference signal for each of the interpolative dividers can come from a common source such as reference PLL 411. The reference PLL 411 can be formed as a simple integer multiplying PLL.

The multi-channel PLL shown in FIG. 4 is suitable for a small geometry CMOS process. Low PLL bandwidth during operation allows for jitter attenuation applications. Higher bandwidth can be used during frequency acquisition. With a digital loop filter, the bandwidth can be set low and with precision and can range, e.g., from several kHz to less than one Hz. Multiple PLLs using VCOs on a single die can exhibit cross talk problems, especially with LC oscillators being used in the VCOs and running at similar frequencies. Because multiple VCOs are absent, there is no significant cross talk generated even if the frequencies supplied to the PLLs, such as those in FIG. 4, are close. In addition, using interpolative dividers as a digitally controlled oscillator provides flexible frequency programmability without adding a significant amount of jitter as compared to conventional fractional dividers used in typical LC based PLLs. Further, the tuning range is significantly increased using the interpolative divider in the PLL. PLLs with LC based voltage controlled oscillators (VCOs) have a limited tuning range due to the minimum to maximum capacitor ratio being about 1:2. In contrast, there is a much larger minimum to maximum divide ratio for the divider in the interpolative divider allowing for a manyfold increase in the tuning range. For LC based PLLs, it is difficult to get LC tuning ranges greater than 50%. However, using the interpolative divider in the PLL allows a tuning range in an embodiment from, e.g., several MHz to hundreds of MHz and even larger. Thus, a tuning range of, e.g., thousands or even tens of thousands of percent can be achieved between the lowest frequency and the highest frequency that can be generated by the PLL, by using the architecture of PLL 100 shown in FIG. 1. For example, in an embodiment the tuning range is at least from 5 MHz to 500 MHz, which is 10,000 percent.

Note that the reference PLL 411 is supplied by a crystal oscillator 423. In other embodiments, the reference signal may be supplied by a microelectromechanical system (MEMS), surface acoustic wave (SAW), or other kind of oscillator. In addition, the reference PLL may be omitted entirely in some embodiments, with the reference frequency being supplied to the interpolative dividers directly from a MEMS oscillator, a SAW oscillator, crystal oscillator, or other high frequency signal available in the system. The reference signal supplied to the interpolative dividers, while shown as coming from a common source, could come from separate sources, such as separate reference PLLs, MEMS, or crystal or other types of oscillators.

Each of the PLLs 401, 403, 405, and 407 may be programmed separately, e.g., from a communications interface (I/F) 419. The communications I/F 419 may write to storage 421 to supply PLL specific programming such as initial divide ratio, loop bandwidth, and other PLL configuration settings. While the number of PLLs shown in FIG. 4 is four (plus the reference PLL), in other embodiments as few as one or more than four PLLs may be supplied on a single integrated circuit.

Thus, a PLL has been described that uses an interpolative divider. The PLL is useful in forming multi-channel PLLs. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. An apparatus comprising:
an interpolative divider configured to receive a first input signal and supply as an output signal the first input signal divided according to a divide ratio, the interpolative divider including,
  a divider configured to receive the first input signal and supply a divided signal divided in accordance with a divide control signal;
  a digital circuit including a delta sigma modulator coupled to receive the divide ratio and generate an integer portion and a digital quantization error and to supply the integer portion as the divide control signal to the divider; and
  a phase interpolator coupled to the divider and to the delta sigma modulator to adjust a phase of the divided signal according to the digital quantization error to reduce error in the divided signal and generate the output signal;
a phase detector coupled to a feedback signal corresponding to the output signal of the interpolative divider and coupled to a second input signal, the phase detector to supply a phase error corresponding to a difference between the second input signal and the feedback signal; and
a loop filter coupled to the phase detector to receive the phase error and to supply a filtered phase error used to determine the divide ratio.

2. The apparatus as recited in claim 1 further comprising a divide ratio storage to store a value for the divide ratio for the interpolative divider.

3. The apparatus as recited in claim 2 wherein the value of the divide ratio is adjusted according to the phase error.

4. The apparatus as recited in claim 3 further comprising a communications interface coupled to the divide ratio register storage to supply a value of the divide ratio.

5. The apparatus, as recited in claim 1, further comprising:
a reference phase-locked loop coupled to receive a clock signal and to supply the first input signal to the interpolative divider.

6. The apparatus as recited in claim 1 wherein the interpolative divider maintains phase lock with the second input signal.

7. An apparatus comprising:
an interpolative divider configured to receive a first input signal and supply as an output signal the first input signal divided according to a divide ratio;
a phase detector coupled to a feedback signal corresponding to the output signal of the interpolative divider and coupled to a second input signal, the phase detector to supply a phase error corresponding to a difference between the second input signal and the feedback signal;
a loop filter coupled to the phase detector to receive the phase error and to supply a filtered phase error used to determine the divide ratio;
a second interpolative divider configured to receive the first input signal and supply as a second output signal the first input signal divided by a second divide ratio;
a second phase detector coupled to a second feedback signal corresponding to the second output signal and coupled to a third input signal, to supply a second phase error corresponding to a difference between the third input signal and the second feedback signal; and
a second loop filter coupled to the second phase detector to supply a filtered second phase error used to determine the second divide ratio.

8. The apparatus as recited in claim 7 further comprising:
an integrated circuit on which is disposed the first and second loop filters; and
first and second input terminals on the integrated circuit to respectively receive the second and third input signals signal.

9. The apparatus as recited in claim 1 further comprising a feedback divider coupled to the output signal of the interpolative divider to provide a divided output signal as the feedback divider signal.

10. A phase-locked loop comprising:
a phase detector coupled to a feedback signal and to an input signal, the phase detector configured to supply a phase detector output signal corresponding to a difference between the input signal and the feedback signal;
a loop filter coupled to receive the phase detector output signal and to provide a loop filter output signal;
a digitally controlled interpolative divider coupled to the loop filter output signal and to a reference clock signal and responsive to a divide ratio signal to supply a divided reference clock signal as an interpolative divider output signal, the divide ratio signal being determined using the loop filter output signal, wherein the digitally controlled interpolative divider includes,
a fractional-N divider configured to receive the reference clock signal and to supply a divided signal divided in accordance with a divide control signal;
a digital circuit including a delta sigma modulator coupled to receive the divide ratio and generate an integer portion and a digital quantization error and to supply the integer portion as the divide control signal to the fractional-N divider; and
a phase interpolator coupled to the fractional-N divider and to the delta sigma modulator to adjust a phase of the divided signal according to the digital quantization error to reduce error in the divided signal and generate the interpolative divider output; and
a feedback divider coupled to divide the interpolative divider output signal to supply the feedback signal.

11. The phase-locked loop as recited in claim 10 wherein a tuning range of the phase-locked loop between a smallest frequency to a largest frequency that can be generated by the phase-locked loop is thousands of percent.

12. A method comprising:
receiving a reference clock signal at an interpolative divider;
generating an interpolative divider output signal in the interpolative divider that is a divided reference clock signal, divided in accordance with a divide ratio;
determining a phase difference between a feedback signal from the interpolative divider and an input clock signal; and
using the phase difference to adjust the interpolative divider output signal through adjusting the divide ratio;
wherein generating the interpolative divider output signal includes,
receiving the reference clock signal at a fractional-N divider and generating a divided signal divided in accordance with a divide control signal;
generating an integer portion and a digital quantization error in a delta sigma modulator and supplying the integer portion as the divide control signal to the fractional-N divider; and
adjusting a phase of the divided signal in a phase interpolator according to the digital quantization error to reduce error in the divided signal and supplying the divided signal with the adjusted phase as the interpolative divider output signal.

13. The method as recited in claim 12 further comprising:
supplying the phase difference to a loop filter; and
supplying a control signal to the interpolative divider from the loop filter to adjust the interpolative divider output signal to maintain lock with the input clock signal.

14. The method as recited in claim 13 further comprising dividing the interpolative divider output signal in a feedback divider signal to generate the feedback signal.

15. A method comprising:
receiving a reference clock signal at an interpolative divider;
generating an interpolative divider output signal in the interpolative divider that is a divided reference clock signal, divided in accordance with a divide ratio;
determining a phase difference between a feedback signal from the interpolative divider and an input clock signal;
receiving the reference clock signal at a second interpolative divider and supplying as a second interpolative divider output signal a second divided reference clock signal, divided according to a second divide ratio;
determining a second phase difference between a second feedback signal from the second interpolative divider and a second clock signal; and
using the phase difference to adjust the second interpolative divider output signal through adjusting the second divide ratio.

16. The method as recited in claim 15, further comprising:
generating the reference clock signal in a reference clock phase-locked loop (PLL) coupled to receive a reference clock PLL input clock signal and supplying the reference clock signal to the first and second interpolative dividers.

17. The method as recited in claim 16 further comprising supplying the reference clock PLL input clock signal from a crystal oscillator.

18. The method as recited in claim 12 further comprising:
initializing the divide ratio for the interpolative divider of a phase-locked loop incorporating the interpolative divider by writing a divide ratio storage location; and
adjusting the initialized divide ratio using the phase difference to maintain phase lock with the input clock signal.

19. The apparatus as recited in claim 7 further comprising:
a first feedback divider coupled to the output signal of the interpolative divider to provide a divided output signal as the feedback signal; and
a second feedback divider coupled to the second output signal of the second interpolative divider to provide a second divided output signal as the second feedback signal.

* * * * *